United States Patent [19]
Rolfson

[11] Patent Number: 5,789,030
[45] Date of Patent: Aug. 4, 1998

[54] METHOD FOR DEPOSITING DOPED AMORPHOUS OR POLYCRYSTALLINE SILICON ON A SUBSTRATE

[75] Inventor: J. Brett Rolfson, Boise, Id.

[73] Assignee: Micron Technology, Inc., Boise, Id.

[21] Appl. No.: 618,281

[22] Filed: Mar. 18, 1996

[51] Int. Cl.$^6$ ................................. B05D 3/04; B05D 3/06
[52] U.S. Cl. ..................... 427/309; 427/534; 427/535;
427/578; 427/255; 427/255.1; 427/255.2;
427/255.7; 438/488; 438/925; 148/DIG. 1;
148/DIG. 122
[58] Field of Search ..................... 427/248.1, 309,
427/255, 255.1, 314, 578, 534, 535, 344,
343, 255.7, 255.2; 437/233, 967; 148/DIG. 1,
DIG. 122; 438/488, 925

[56] References Cited

U.S. PATENT DOCUMENTS

| | | | |
|---|---|---|---|
| 5,096,856 | 3/1992 | Freeman | 438/488 |
| 5,135,886 | 8/1992 | Manocha et al. | 437/101 |
| 5,198,387 | 3/1993 | Tang | 437/101 |
| 5,256,566 | 10/1993 | Bailey | 437/233 |
| 5,352,636 | 10/1994 | Beinglass | 437/235 |

FOREIGN PATENT DOCUMENTS 2-177375  7/1990  Japan .

OTHER PUBLICATIONS

Wolf, S. and Tauber R. N., *Silicon Processing for the VLSI Era, Vol. 1—Process Technology*, Lattice Press, 1986, pp. 177–182.

Ghandhi, Sorab K., *VLSI Fabrication Principles, Silicon and Gallium Arsenide*, 1994, pp. 537–539.

Primary Examiner—Roy V. King
Attorney, Agent, or Firm—Stephen A. Gratton

[57] ABSTRACT

A method for forming an in-situ doped amorphous or polycrystalline silicon thin film on a substrate is provided. The method includes placing the substrate in a reaction chamber of a CVD reactor and introducing a silicon gas species into the reaction chamber. The flow of the silicon gas species is continued for a time period sufficient to dehydrate the substrate and form a thin layer of silicon. Following formation of the thin layer of silicon, a dopant gas species is introduced into the reaction chamber and continued with the flow of the silicon gas species to form the doped silicon thin film. In an illustrative embodiment a phosphorus doped amorphous silicon thin film for a cell plate of a semiconductor capacitor is formed in a LPCVD reactor.

25 Claims, 3 Drawing Sheets

---

PLACING A SUBSTRATE INTO A REACTION CHAMBER OF A REACTOR.

INTRODUCING A SILICON GAS SPECIES INTO THE REACTION CHAMBER.

REMOVING CONTAMINANTS FROM THE SUBSTRATE AND FORMING A THIN LAYER OF SILICON BY DECOMPOSITION OF THE SILICON GAS SPECIES.

INTRODUCING A DOPANT GAS SPECIES INTO THE REACTION CHAMBER TO FORM A DOPED SILICON THIN FILM ON THE THIN LAYER OF SILICON.

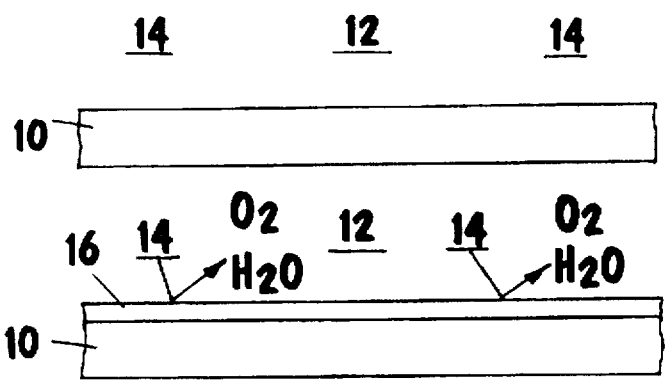
FIGURE 2A
FIGURE 2B
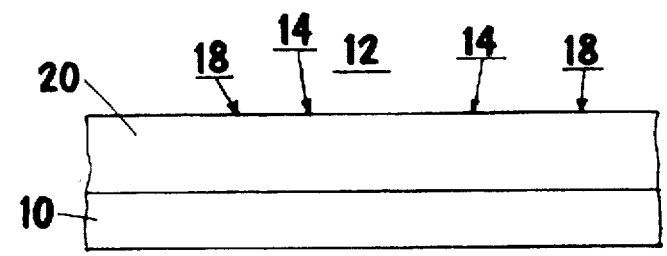
FIGURE 2C

5,789,030

1

METHOD FOR DEPOSITING DOPED AMORPHOUS OR POLYCRYSTALLINE SILICON ON A SUBSTRATE

FIELD OF THE INVENTION

This invention relates generally to semiconductor manufacture and specifically to an improved method for depositing doped amorphous or polycrystalline silicon thin films on a substrate.

BACKGROUND OF THE INVENTION

Thin films of amorphous and polycrystalline silicon are widely used in semiconductor manufacture. For example, doped amorphous silicon can be used to form the cell plates of storage capacitors for dynamic random access memories (DRAM). Doped polycrystalline silicon can be used to form interconnects, gate electrodes, emitter structures and resistors.

These silicon thin films are typically formed by LPCVD (low pressure chemical vapor deposition) by decomposition of a silicon gas species such as silane ($SiH_4$) or disilane ($Si_2H_6$). Doping can also be accomplished in the gas phase by introducing a dopant gas species such as diborane ($B_2H_6$), arsine ($AsH_3$) or phosphine ($PH_3$).

The deposition temperature during LPCVD is typically from 500° C. to 675° C. and the pressure is typically from 200 mTorr to 2 Torr. The crystalline structure of the "as deposited" film is largely a function of the deposition temperature. At temperatures below about 550° C. the "as deposited" films have an amorphous structure. At temperatures between about 550° C. to 580° C. there is a transition between amorphous silicon and polycrystalline silicon. Hemispherical grain (HSG) polysilicon is typically grown in this transitional range. At temperatures above about 580° C. the "as deposited" films have a polycrystalline structure.

In addition to LPCVD, there are other methods for depositing thin films of amorphous and polycrystalline silicon. One such method is plasma-enhanced chemical vapor deposition (PECVD). With PECVD an rf-induced glow discharge is used to transfer energy into the reactant gases. Advantages of PECVD include lower substrate temperatures and higher deposition rates. A representative temperature range for PECVD of silicon thin films is about 350° C. to 450° C. Another method for depositing amorphous and polycrystalline silicon thin films is RTCVD (Rapid Thermal Chemical Vapor Deposition). With RTCVD the substrate is typically rapidly heated by lamps and the reactant gases are introduced.

One problem that occurs during deposition of in-situ doped amorphous or polycrystalline silicon thin film is the degradation of the underlying substrate film by reaction of the dopant species with contaminants on the substrate. Specifically, an underlying substrate layer can be attacked by acidic gases formed by the dopant species during the deposition process. For example, with a phosphine ($PH_3$) dopant species, phosphoric acid ($H_3PO_4$) can be generated by the reaction of phosphine ($PH_3$) with oxygen ($O_2$) or water ($H_2O$) present on the substrate or in the reaction chamber. Phosphoric acid is highly corrosive and can attack an underlying substrate film such as silicon nitride ($Si_3N_4$).

These problems are compounded by the increased use of HSG or rugged polysilicon. This type of polysilicon increases the surface area and the "trapping" area on the substrate for contaminants. In addition, during CVD of silicon, the deposition process does not occur immediately

2 upon introduction of the reactant gases. This phenomena is known in the art as the "inhibition effect". The "inhibition effect" gives the reactant gases time to combine with contaminants to form corrosive by-products which can attack the unprotected substrate.

In view of the foregoing, it is an object of the present invention to provide an improved method for depositing doped amorphous and polycrystalline silicon thin films without degradation of an underlying substrate film.

It is a further object of the present invention to provide an improved CVD process for forming doped amorphous and polycrystalline silicon thin films.

It is yet another object of the present invention to provide an improved semiconductor structure, such as a storage capacitor, having a doped amorphous or polycrystalline silicon thin film.

Other objects, advantages and capabilities of the present invention will become more apparent as the description proceeds.

SUMMARY OF THE INVENTION

In accordance with the invention, a method for depositing an in-situ doped amorphous or polycrystalline silicon thin film on a substrate is provided. The method is carried out in a reaction chamber of a CVD reactor and can be a LPCVD, PECVD or RTCVD process. The method, simply stated, comprises introducing a silicon gas species into the reaction chamber for a time period sufficient to dehydrate the substrate and to form a thin layer of silicon on the substrate. Following formation of the thin layer of silicon, a dopant gas species is introduced into the reaction chamber to form the doped silicon thin film.

Because the dopant gas species is introduced into the reaction chamber after dehydration of the substrate, corrosive acids are not formed by reaction of the dopant gas species with contaminants on the substrate. In addition, the substrate is protected by the previously formed thin layer of silicon.

In an illustrative embodiment, phosphorus doped amorphous silicon is deposited on a substrate comprising a thin film of a dielectric material such as silicon nitride, using a LPCVD process. Initially, a silicon gas species, such as silane or disilane, is injected into the reaction chamber for several minutes to dehydrate the substrate and form a thin layer of silicon. Following formation of the thin layer of silicon, a dopant gas species such as phosphine ($PH_3$), is injected into the reaction chamber. By injecting the dopant gas species after formation of the thin layer of silicon, the formation of an acid, such as phosphoric acid ($H_3PO_4$), is prevented and the substrate is protected by the thin layer of silicon.

BRIEF DESCRIPTION OF THE DRAWINGS

FIGS. 2A–2C are schematic cross sectional views illustrating formation of a doped amorphous or polycrystalline silicon thin film on a substrate in accordance with the invention.

DETAILED DESCRIPTION OF THE PREFERRED EMBODIMENT

Figure 1:
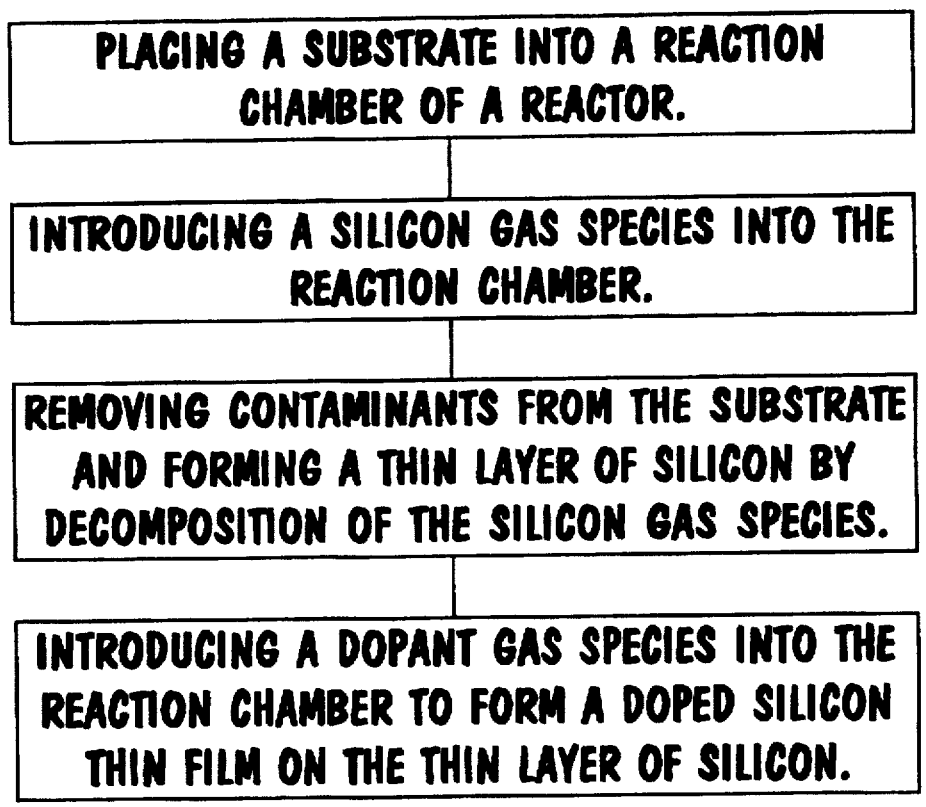
FIG. 1 is a flow diagram of process steps in the method of the invention.

Referring to FIG. 1, steps in a method for forming a doped amorphous or polycrystalline silicon thin film on a substrate in accordance with the invention are shown. The method includes the steps of:

A. Placing a substrate into a reaction chamber of a reactor.
B. Introducing a silicon gas species into the reaction chamber.
C. Removing contaminants from the substrate and forming a thin layer of silicon by decomposition of the silicon gas species.
D. Introducing a dopant gas species into the reaction chamber to form a doped amorphous or polycrystalline silicon thin film on the thin layer of silicon.

Referring to FIGS. 2A–2C, the method of the invention is illustrated in schematic form. Initially, a substrate 10 is placed in a reaction chamber 12 of a CVD reactor. The CVD reactor can be a LPCVD reactor, a PECVD reactor or a RTCVD reactor. All of these types of CVD reactors are commercially available.

LPCVD reactors are typically operated at temperatures of from 500°–675° C. and at a vacuum of from 200 mTorr–2.0 Torr. An LPCVD reactor can be a horizontal tube reactor or a vertical flow isothermal reactor. PECVD reactors are typically operated at temperatures of from 350° C. to 450° C. and at the same vacuum pressure as LPCVD reactors. In addition, PECVD reactors typically include an additional rf energy source. RTCVD reactors are typically operated at the same temperatures and pressures as LPCVD reactors but with an additional energy source such as UV lamps for rapidly heating the substrate.

The reaction chamber 12 of the CVD reactor can be in flow communication with a gas feed conduit for injecting a silicon gas species and a dopant gas species into the reaction chamber. In addition, the reaction chamber 12 can be in flow communication with an exhaust conduit for exhausting gaseous by-products.

The substrate 10 can be contained on wafers held within the reaction chamber 12 in caged boats or other holders. As will be further explained, the substrate 10 can be a thin film such as a dielectric layer formed on the wafer. Depending on prior process steps, the substrate 10 will typically include oxides and minute amounts of water and other contaminants.

Initially, a silicon gas species 14 is injected into the reaction chamber 12 and flowed over the substrate 10. The silicon gas species 14 can be silane ($SiH_4$) or disilane ($Si_2H_6$). Higher order silicon species such as trisilane ($Si_3H_8$) and dichlorosilane ($SiH_2Cl_2$) can also be used. As shown in FIGS. 2B, the silicon gas species 14 decomposes in the reaction chamber 12 and a thin layer of silicon 16 begins to form on the substrate 10. With silane as a silicon gas species 14, this reaction can be characterized by the formulae:

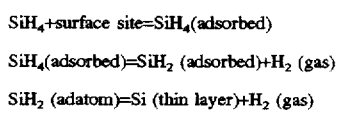

Formation of the thin layer of silicon 16 also causes contaminants such as oxygen ($O_2$) and water ($H_2O$) present on the surface of the substrate 10 to be removed by the heat and reactants present in the reaction chamber 12. These contaminants are subsequently exhausted from the reaction chamber 12 with other reaction by-products. Accordingly, the silicon gas species 14 in addition to forming the thin layer of silicon 16, also functions to dehydrate and clean the substrate 10.

Depending on process conditions, the flow of the silicon gas species 14 can be continued for several minutes or more.

The thin layer of silicon 16 is preferably only a single atomic layer (i.e., monolayer) or several monolayers thick.

It is also well known in the art that there is an "inhibition effect" during CVD deposition of silicon. Because of the "inhibition effect" formation of the thin silicon layer 16 does not occur immediately. However, with only a silicon gas species 14 present in the reaction chamber 12, the "inhibition effect" is of no consequence because other reactants are not present within the reaction chamber 12. For example, with prior art CVD processes due to the "inhibition effect" a dopant gas species would have time to react with the contaminants present on the substrate 10 and form corrosive by-products such as acids.

Referring to FIG. 2C, with the thin layer of silicon 16 formed and the substrate 10 dehydrated, a dopant gas species 18 is injected into the reaction chamber 12. The silicon gas species 14 and the dopant gas species 18 decompose and combine on the substrate 10 to form a doped layer of silicon 20. The flow of the silicon gas species 14 and dopant gas species 18 can be continued for a time period sufficient to form the doped layer of silicon 20 to a desired thickness and with a desired dopant concentration.

Suitable dopant gas species 18 for doping the doped layer of silicon 20 include phosphine ($PH_3$), diborane ($B_2H_6$) and arsine ($AsH_3$). Because the surface of the substrate 10 has been cleaned and dehydrated by the silicon gas species 14 corrosive acids such as phosphoric acid ($H_3PO_4$) are less likely to form. In addition, the thin layer of silicon 16 protects the substrate 10 from any corrosive acids that do form.

EXAMPLE

Figure 3:
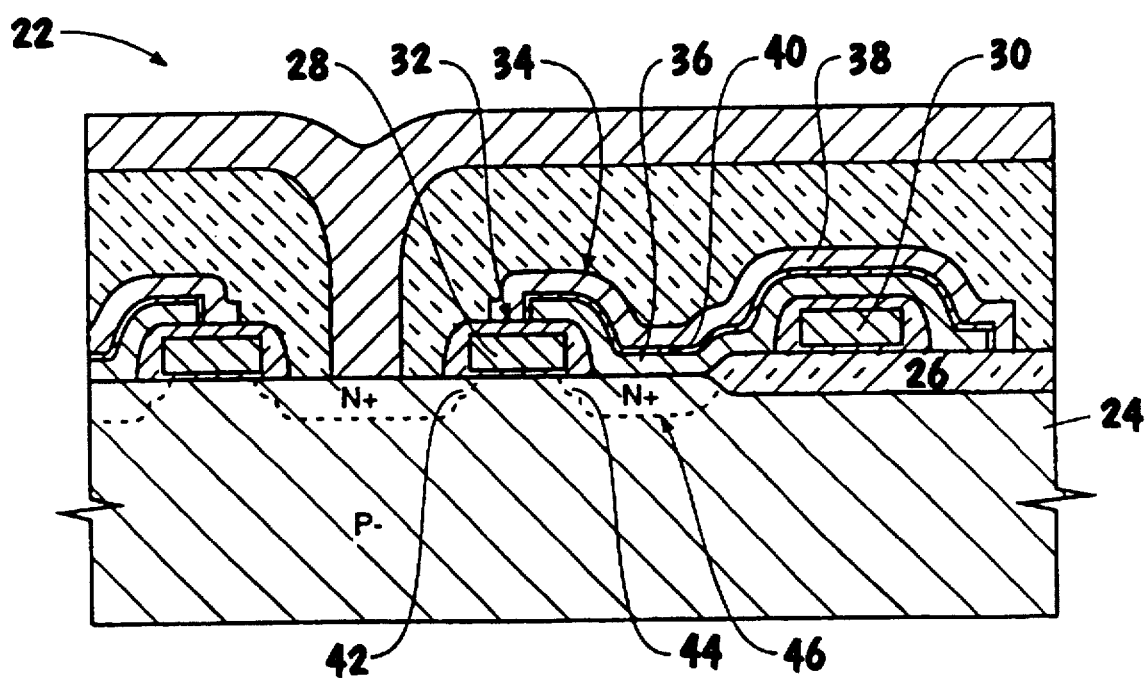
FIG. 3 is an enlarged cross sectional view of a semiconductor structure that includes a doped amorphous silicon thin film formed on a substrate in accordance with the invention.

Referring to FIG. 3, a cross sectional view of a semiconductor structure 22 formed using the method of the invention is shown. The semiconductor structure 22 includes a (P−) silicon substrate 24 having (N+) region 46 and a field oxide 26. An access transistor 32 and a storage capacitor 34 are formed on the substrate 24. The access transistor 32 includes a source 42, a drain 44 and a word line gate 28. The storage capacitor 34 includes a lower cell plate 36 in electrical communication with the access transistor drain 44. In addition the storage capacitor 34 includes a dielectric layer 40 formed of silicon nitride ($Si_3N_4$). Each of these elements can be formed using techniques that are known in the art.

An upper cell plate 38 of the storage capacitor 34 is formed using the method of the invention as a layer of in-situ doped amorphous silicon. Prior to the deposition process for forming the upper cell plate 38 a dielectric (e.g., $Si_3N_4$) is deposited and the entire substrate is typically treated to a steam oxidation process leaving the re-oxidized surface of the cell dielectric 40 exposed for silicon deposition.

In this example silicon deposition is performed using a LPCVD process. A typical LPCVD process can be performed with 6 inch wafers using a SVG 6000 Vertical Thermal Reactor (VTR) manufactured by the Silicon Valley Group of Santa Clara, Calif. Process conditions include a temperature of 535° C. and a pressure of 225 mTorr.

Initially, the wafers are placed in the reaction chamber. Next push, temperature ramp, stabilization steps and pump/purge cycles can be performed according to standard procedures. Silane ($SiH_4$) is then introduced into the reaction chamber at a flow rate of about 500 sccm. The flow of the silane ($SiH_4$) is continued for from 1–5 minutes. This dehydrates the surface of the dielectric layer 40 removing contaminants such as oxygen and trapped moisture. In addition, a thin layer of silicon is formed on the surface of the dielectric layer 40.

With the thin layer of silicon formed, phosphine (PH₃) is introduced into the reaction chamber at a flow rate of 250 sccm. The flow of the silane and phosphine is continued for from 45 to 180 minutes to form the upper plate 38 with a thickness of from 500 to 2000 Å.

Thus the invention provides an improved method for forming an in-situ doped amorphous or polycrystalline thin film on a substrate. While the invention has been described with reference to certain preferred embodiments, as will be apparent to those skilled in the art, certain changes and modifications can be made without departing from the scope of the invention as defined by the following claims.

I claim:

1. A method for forming an in-situ doped silicon thin film on a substrate comprising:
    placing the substrate in a reaction chamber of a reactor;
    heating the substrate;
    introducing a silicon gas species into the reaction chamber for a time period sufficient to form a layer of silicon on the substrate and to remove contaminants present on the substrate, the layer of silicon having a thickness of from one to several monolayers; and
    following formation of the layer of silicon, introducing a dopant gas species into the reaction chamber to form the doped silicon thin film.

2. The method as claimed in claim 1 wherein the reactor comprises an element selected from the group consisting of low pressure chemical vapor deposition (LPCVD) reactors, plasma enhanced chemical vapor deposition (PECVD) reactors and rapid thermal chemical vapor deposition (RTCVD) reactors.

3. The method as claimed in claim 1 wherein heating the substrate comprises heating to a temperature below about 580° C. and the silicon thin film comprises amorphous silicon.

4. The method as claimed in claim 1 wherein heating the substrate comprises heating to a temperature above about 580° C. and the silicon thin film comprises polycrystalline silicon.

5. The method as claimed in claim 1 wherein the reactor comprises a low pressure chemical vapor deposition (LPCVD) reactor and heating the substrate comprises heating to a temperature between about 500°–675° C.

6. The method as claimed in claim 1 wherein the reactor comprises a plasma enhanced chemical vapor deposition (PECVD) reactor and heating the substrate comprises heating to a temperature of between about 350° C.–450° C.

7. The method as claimed in claim 1 wherein the reactor comprises a rapid thermal chemical vapor deposition (RTCVD) reactor and the substrate is heated with UV lamps.

8. The method as claimed in claim 1 wherein the silicon gas species comprises a gas selected from the group consisting of silane ($SiH_4$), disilane ($Si_2H_6$), trisilane ($Si_3H_8$), and dichlorosilane ($SiH_2Cl_2$).

9. The method as claimed in claim 1 wherein the dopant gas species comprises a gas selected from the group consisting of phosphine ($PH_3$), diborane ($B_2H_6$) and arsine ($AsH_3$).

10. The method as claimed in claim 1 wherein the substrate comprises a dielectric layer.

11. The method as claimed in claim 1 wherein the time period comprises about 1 to 5 minutes.

12. A method for forming an in-situ doped silicon thin film on a substrate comprising:
    placing the substrate in a reaction chamber of a reactor;
    heating the substrate;
    introducing a silicon gas species into the reaction chamber for a time period sufficient to remove contaminants from the substrate and to form a layer of silicon on the substrate, the layer of silicon having a thickness of from one to several atomic layers; and
    following formation of the layer of silicon, introducing a dopant gas species into the reaction chamber to form the doped silicon thin film on the layer of silicon.

13. The method as claimed in claim 12 and wherein the reactor comprises an element selected from the group consisting of low pressure chemical vapor deposition (LPCVD) reactors, plasma enhanced chemical vapor deposition (PECVD) reactors and rapid thermal chemical vapor deposition (RTCVD) reactors.

14. The method as claimed in claim 12 wherein the contaminants comprise oxygen ($O_2$) and $H_2O$.

15. The method as claimed in claim 12 wherein heating the substrate comprises heating to a temperature below about 550° C. and the silicon thin film comprises amorphous silicon.

16. The method as claimed in claim 12 wherein heating the substrate comprises heating to a temperature between about 550°–580° C. and the silicon thin film comprises hemispherical grain polysilicon.

17. The method as claimed in claim 12 wherein heating the substrate comprises heating to a temperature above about 580° C. and the silicon thin film comprises polycrystalline.

18. The method as claimed in claim 12 wherein the silicon gas species comprises a gas selected from the group consisting of silane ($SiH_4$), disilane ($Si_2H_6$), trisilane ($Si_3H_8$), and dichlorosilane ($SiH_2Cl_2$).

19. A method for forming an in-situ doped silicon thin film on a substrate comprising:
    placing the substrate in a reaction chamber of a reactor;
    heating the substrate;
    introducing a silicon gas species into the reaction chamber;
    removing contaminants from the substrate and forming a layer of silicon on the substrate by decomposition of the silicon gas species, the layer of silicon having a thickness of from one to several monolayers; and
    following formation of the layer of silicon, introducing a dopant gas species into the reaction chamber to form the doped silicon thin film on the layer of silicon;
    wherein the dopant gas species comprises a gas selected from the group consisting of phosphine ($PH_3$) diborane ($B_2H_6$) and arsine ($AsH_3$).

20. A method for forming an in-situ doped amorphous silicon thin film on a substrate comprising:
    placing the substrate in a reaction chamber of a reactor;
    heating the substrate;
    introducing a silicon gas species into the reaction chamber;
    removing contaminants from the substrate and forming a layer of silicon on the substrate by decomposition of the silicon gas species, the layer of silicon having a thickness of from one to several monolayers; and
    following formation of the layer of silicon, introducing a dopant gas species into the reaction chamber, the dopant gas species comprising phosphine ($PH_3$) to form the doped amorphous silicon thin film on the layer of silicon.

21. A method for forming an in-situ doped amorphous silicon thin film on a silicon nitride ($Si_3N_4$) thin film substrate comprising:

placing the substrate in a reaction chamber of a reactor;

heating the substrate;

introducing a silicon gas species into the reaction chamber;

removing contaminants from the substrate and forming a layer of silicon on the substrate by decomposition of the silicon gas species, the layer of silicon having a thickness of from one to several monolayers; and following formation of the layer of silicon, introducing a dopant gas species into the reaction chamber, the dopant gas species comprising phosphine ($PH_3$).

22. A method for forming a phosphorus doped silicon thin film on a substrate comprising:

placing the substrate in a reaction chamber of a LPCVD reactor;

heating the substrate to a temperature of about 500°–580° C.;

introducing a silicon gas species selected from the group consisting of silane ($SiH_4$), disilane ($Si_2H_6$), trisilane ($Si_3H_8$), and dichlorosilane ($SiH_2Cl_2$) into the reaction chamber for from 1 to 5 minutes to dehydrate the substrate and form a layer of silicon on the substrate, the layer of silicon having a thickness of from one to several monolayers; and following formation of the layer of silicon, introducing a dopant gas species comprising phosphine ($PH_3$) into the reaction chamber to form the phosphorus doped silicon thin film on the layer of silicon.

23. The method as claimed in claim 22 wherein the substrate comprises a dielectric layer.

24. The method as claimed in claim 22 wherein the doped silicon thin film comprises a cell plate for a capacitor.

25. The method as claimed in claim 23 wherein the dielectric layer comprises silicon nitride ($Si_3N_4$).

* * * * *